(12) United States Patent
Lin et al.

(10) Patent No.: US 10,985,155 B1
(45) Date of Patent: Apr. 20, 2021

(54) EMBEDDED N-CHANNEL METAL OXIDE SEMICONDUCTOR (NMOS) TRIGGERED SILICON CONTROLLED RECTIFICATION DEVICE

(71) Applicant: AMAZING MICROELECTRONIC CORP., New Taipei (TW)

(72) Inventors: Kun-Hsien Lin, Hsinchu (TW); Zi-Ping Chen, New Taipei (TW); Che-Hao Chuang, Hsinchu County (TW); Tun-Chih Yang, New Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/583,544

(22) Filed: Sep. 26, 2019

(51) Int. Cl.
 *H01L 27/02* (2006.01)
 *H01L 29/06* (2006.01)
 *H01L 29/74* (2006.01)

(52) U.S. Cl.
 CPC ...... *H01L 27/0262* (2013.01); *H01L 29/0626* (2013.01); *H01L 29/742* (2013.01)

(58) Field of Classification Search
 CPC ........................................ H01L 27/0248–0296
 See application file for complete search history.

(56) References Cited

U.S. PATENT DOCUMENTS

| 7,825,473 | B2 | 11/2010 | Ker et al. | |
| 8,102,001 | B2 | 1/2012 | Ker et al. | |
| 2012/0305984 | A1* | 12/2012 | Campi, Jr. | ............ H01L 29/742 257/124 |
| 2014/0167106 | A1* | 6/2014 | Salcedo | ................. H01L 29/78 257/146 |
| 2018/0301445 | A1 | 10/2018 | Yam et al. | |

* cited by examiner

*Primary Examiner* — Moazzam Hossain
*Assistant Examiner* — Mohammad A Rahman
(74) *Attorney, Agent, or Firm* — Rosenberg, Klein & Lee

(57) ABSTRACT

An embedded NMOS triggered silicon controlled rectification device includes a P-type substrate, at least one rectifying zone, and at least one trigger. The rectifying zone includes a first N-type heavily doped area, an N-type well, and a first P-type heavily doped area. Alternatively, the device includes an N-type substrate, a first P-type well, at least one rectifying zone, and at least one trigger. The rectifying zone includes a second P-type well, a first N-type heavily doped area, and a first P-type heavily doped area. The trigger cooperates with the P-type substrate or the first P-type well to form at least one NMOSFET. The trigger is independent to the rectifying zone. The first P-type heavily doped area is arranged between the trigger and the first N-type heavily doped area.

25 Claims, 9 Drawing Sheets

EMBEDDED N-CHANNEL METAL OXIDE SEMICONDUCTOR (NMOS) TRIGGERED SILICON CONTROLLED RECTIFICATION DEVICE

BACKGROUND OF THE INVENTION

Field of the Invention

The present invention relates to a silicon controlled rectification device, particularly to an embedded N-channel metal oxide semiconductor (NMOS) triggered silicon controlled rectification device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

The working principle of ESD protection device is shown in FIG. 1. In FIG. 1, the ESD protection device 10 is connected in parallel with a protected circuit 12 on the IC chip. The ESD protection device 10 would be triggered immediately when the ESD event occurs. In that way, the ESD protection device 10 can provide a superiorly low resistance path for discharging the transient ESD current, so that the energy of the ESD transient current can be bypassed by the ESD protection device 10. Silicon-controlled rectifier (SCR) devices exhibit strong ESD robustness and strong current discharge capacity per unit area. SCR devices are widely used as on-chip structures for electrostatic discharge (ESD) protection. When the on-chip structures are integrated in a low-operating power source IC device, the high triggering voltage of an SCR device faces limitations in the range of applications. Therefore, some advanced techniques, such as Zener diode triggered SCR (alternatively referred to as Zener-triggered SCR) devices have been proposed to enhance the ESD efficiency. However, conventional Zener-triggered SCR devices consume a large silicon real estate. Conventional SCR devices also face the problems of lower current discharge capacity per unit area. Besides, the U.S. Pat. No. 7,825,473 disclosed a silicon controlled rectifier, wherein a P-channel metal oxide semiconductor field effect transistor (PMOSFET) is arranged between the anode and the cathode of the silicon controlled rectifier. Thus, the distance between the anode and the cathode of the silicon controlled rectifier is increased to increase the turn-on resistance of the silicon controlled rectifier. Accordingly, the clamping voltage of the silicon controlled rectifier is not effectively decreased.

To overcome the abovementioned problems, the present invention provides an embedded N-channel metal oxide semiconductor (NMOS) triggered silicon controlled rectification device, so as to solve the afore-mentioned problems of the prior art.

SUMMARY OF THE INVENTION

The primary objective of the present invention is to provide an embedded N-channel metal oxide semiconductor (NMOS) triggered silicon controlled rectification device, which uses an N-channel metal oxide semiconductor field effect transistor (NMOSFET) and a signal detector to decrease the clamping voltage and increase the speed of bypassing an electrostatic discharge (ESD) current without passing through an NMOSFET and has low-voltage applications.

To achieve the abovementioned objectives, the present invention provides an embedded N-channel metal oxide semiconductor (NMOS) triggered silicon controlled rectification device, which comprises: a P-type substrate; at least one rectifying zone, arranged in the P-type substrate and electrically connected to an anode and a cathode, comprising: a first N-type heavily doped area arranged in the P-type substrate and electrically connected to the cathode; an N-type well arranged in the P-type substrate; and a first P-type heavily doped area arranged in the N-type well and electrically connected to the anode; and at least one trigger, arranged in the P-type substrate and the N-type well, cooperating with the P-type substrate to form at least one N-channel metal oxide semiconductor field effect transistor (NMOSFET), the at least one trigger is independent to the at least one rectifying zone, and the first P-type heavily doped area is arranged between the at least one trigger and the first N-type heavily doped area.

In an embodiment of the present invention, the NMOS triggered silicon controlled rectification device further comprises a signal detector electrically connected to the at least one trigger, the anode, and the cathode, when an electrostatic discharge (ESD) voltage occurs at the anode, the signal detector receives the ESD voltage to turn on the at least one NMOSFET, thereby triggering the first P-type heavily doped area, the N-type well, the P-type substrate, and the first N-type heavily doped area to bypass an electrostatic discharge (ESD) current.

In an embodiment of the present invention, the signal detector turns off the at least one NMOSFET when the ESD voltage disappears.

In an embodiment of the present invention, the at least one rectifying zone further comprises a second P-type heavily doped area arranged in the P-type substrate and electrically connected to the cathode.

In an embodiment of the present invention, the at least one trigger further comprises: a second N-type heavily doped area arranged in the P-type substrate and the N-type well, and the first P-type heavily doped area is arranged between the first N-type heavily doped area and the second N-type heavily doped area; a third N-type heavily doped area, arranged in the P-type substrate, separating from the second N-type heavily doped area; a dielectric layer arranged on the P-type substrate between the second N-type heavily doped area and the third N-type heavily doped area; and a conductive layer arranged on the dielectric layer and electrically connected to the signal detector, and the second N-type heavily doped area, the third N-type heavily doped area, the dielectric layer, the conductive layer, and the P-type substrate form the at least one NMOSFET.

In an embodiment of the present invention, the NMOS triggered silicon controlled rectification device further comprises a third P-type heavily doped area arranged in the P-type substrate and electrically connected to the third N-type heavily doped area through a conductive wire.

In an embodiment of the present invention, the at least one trigger further comprises: a second N-type heavily doped area arranged in the N-type well, and the first P-type heavily doped area is arranged between the first N-type heavily doped area and the second N-type heavily doped area; a third N-type heavily doped area arranged in the P-type substrate and electrically connected to the second N-type heavily doped area through a conductive wire; a fourth N-type heavily doped area, arranged in the P-type substrate, separating from the third N-type heavily doped area; a dielectric layer arranged on the P-type substrate between the third N-type heavily doped area and the fourth N-type heavily doped area; and a conductive layer arranged on the dielectric layer and electrically connected to the signal detector, and the third N-type heavily doped area, the fourth N-type heavily doped area, the dielectric layer, the conductive layer, and the P-type substrate form the at least one NMOSFET.

In an embodiment of the present invention, the NMOS triggered silicon controlled rectification device further comprises a third P-type heavily doped area arranged in the P-type substrate and electrically connected to the fourth N-type heavily doped area through a conductive wire.

In an embodiment of the present invention, the at least one rectifying zone further comprises two rectifying zones arranged symmetric to each other.

In an embodiment of the present invention, the at least one trigger further comprises two triggers arranged symmetric to each other.

In an embodiment of the present invention, the NMOS triggered silicon controlled rectification device further comprises a first P-type well arranged in the P-type substrate, and the at least one trigger is arranged in the first P-type well.

In an embodiment of the present invention, the at least one rectifying zone further comprises a second P-type well arranged in the P-type substrate, and the first N-type heavily doped area arranged in the second P-type well.

In an embodiment of the present invention, the signal detector further comprises: a resistor and a capacitor electrically connected in series and electrically connected between the anode and the cathode, and the cathode is grounded; and an inverter electrically connected to the at least one trigger, the anode, the cathode, and a node between the resistor and the capacitor, and when the ESD voltage occurs at the anode, the inverter, the resistor, and the capacitor receive the ESD voltage to turn on the at least one NMOSFET.

The present invention provides an embedded N-channel metal oxide semiconductor (NMOS) triggered silicon controlled rectification device, which comprises: an N-type substrate; a first P-type well arranged in the N-type substrate; at least one rectifying zone, arranged in the N-type substrate and electrically connected to an anode and a cathode, comprising: a second P-type well arranged in the N-type substrate; a first N-type heavily doped area arranged in the second P-type well and electrically connected to the cathode; and a first P-type heavily doped area arranged in the N-type substrate and electrically connected to the anode; and at least one trigger, arranged in the N-type substrate and the first P-type well, cooperating with the first P-type well to form at least one N-channel metal oxide semiconductor field effect transistor (NMOSFET), the at least one trigger is independent to the at least one rectifying zone, and the first P-type heavily doped area is arranged between the at least one trigger and the first N-type heavily doped area.

In an embodiment of the present invention, the NMOS triggered silicon controlled rectification device further comprises a signal detector electrically connected to the at least one trigger, the anode, and the cathode, when an electrostatic discharge (ESD) voltage occurs at the anode, the signal detector receives the ESD voltage to turn on the at least one NMOSFET, thereby triggering the first P-type heavily doped area, the N-type substrate, the second P-type well, and the first N-type heavily doped area to bypass an electrostatic discharge (ESD) current.

In an embodiment of the present invention, the signal detector turns off the at least one NMOSFET when the ESD voltage disappears.

In an embodiment of the present invention, the at least one rectifying zone further comprises a second P-type heavily doped area arranged in the second P-type well and electrically connected to the cathode.

In an embodiment of the present invention, the at least one trigger further comprises: a second N-type heavily doped area arranged in the N-type substrate and the first P-type well, and the first P-type heavily doped area is arranged between the first N-type heavily doped area and the second N-type heavily doped area; a third N-type heavily doped area, arranged in the first P-type well, separating from the second N-type heavily doped area; a dielectric layer arranged on the first P-type well between the second N-type heavily doped area and the third N-type heavily doped area; and a conductive layer arranged on the dielectric layer and electrically connected to the signal detector, and the second N-type heavily doped area, the third N-type heavily doped area, the dielectric layer, the conductive layer, and the first P-type well form the at least one NMOSFET.

In an embodiment of the present invention, the NMOS triggered silicon controlled rectification device further comprises a third P-type heavily doped area arranged in the first P-type well and electrically connected to the third N-type heavily doped area through a conductive wire.

In an embodiment of the present invention, the at least one trigger further comprises: a second N-type heavily doped area arranged in the N-type substrate, and the first P-type heavily doped area is arranged between the first N-type heavily doped area and the second N-type heavily doped area; a third N-type heavily doped area arranged in the first P-type well and electrically connected to the second N-type heavily doped area through a conductive wire; a fourth N-type heavily doped area, arranged in the first P-type well, separating from the third N-type heavily doped area; a dielectric layer arranged on the first P-type well between the third N-type heavily doped area and the fourth N-type heavily doped area; and a conductive layer arranged on the dielectric layer and electrically connected to the signal detector, and the third N-type heavily doped area, the fourth N-type heavily doped area, the dielectric layer, the conductive layer, and the first P-type well form the at least one NMOSFET.

In an embodiment of the present invention, the NMOS triggered silicon controlled rectification device further comprises a third P-type heavily doped area arranged in the first P-type well and electrically connected to the fourth N-type heavily doped area through a conductive wire.

In an embodiment of the present invention, the at least one rectifying zone further comprises two rectifying zones arranged symmetric to each other.

In an embodiment of the present invention, the at least one trigger further comprises two triggers arranged symmetric to each other.

In an embodiment of the present invention, the at least one rectifying zone further comprises an N-type well arranged in the N-type substrate, and the first P-type heavily doped area and the at least one trigger are arranged in the N-type well.

In an embodiment of the present invention, the signal detector further comprises: a resistor and a capacitor electrically connected in series and electrically connected between the anode and the cathode, and the cathode is grounded; and an inverter electrically connected to the at least one trigger, the anode, the cathode, and a node between the resistor and the capacitor, and when the ESD voltage occurs at the anode, the inverter, the resistor, and the capacitor receive the ESD voltage to turn on the at least one NMOSFET.

Below, the embodiments are described in detail in cooperation with the drawings to make easily understood the technical contents, characteristics and accomplishments of the present invention.

DETAILED DESCRIPTION OF THE INVENTION

Figure 1:
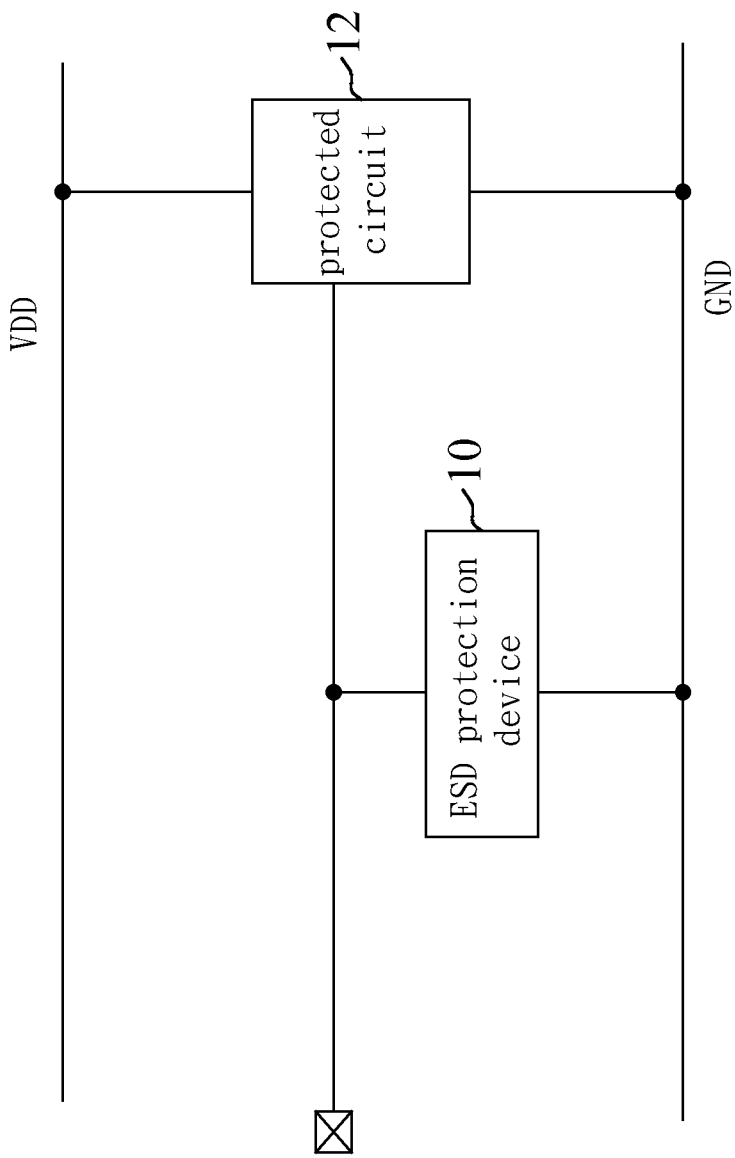
FIG. 1 is a schematic diagram illustrating an ESD protection device connected with a protected circuit on an IC chip in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Figure 2:
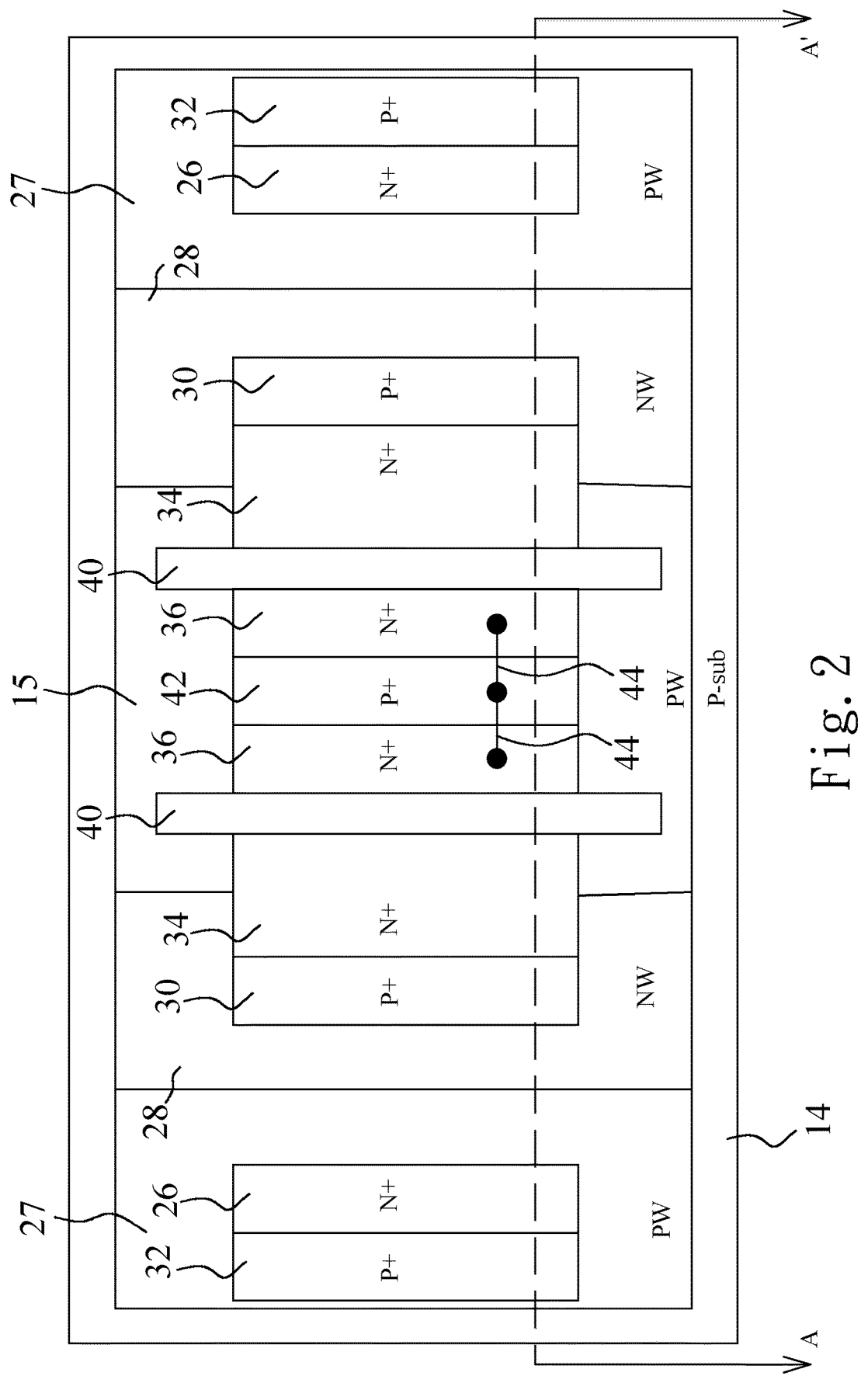
FIG. 2 is a top view of an embedded N-channel metal oxide semiconductor (NMOS) triggered silicon controlled rectification device according to the first embodiment of the present invention.
Figure 3:
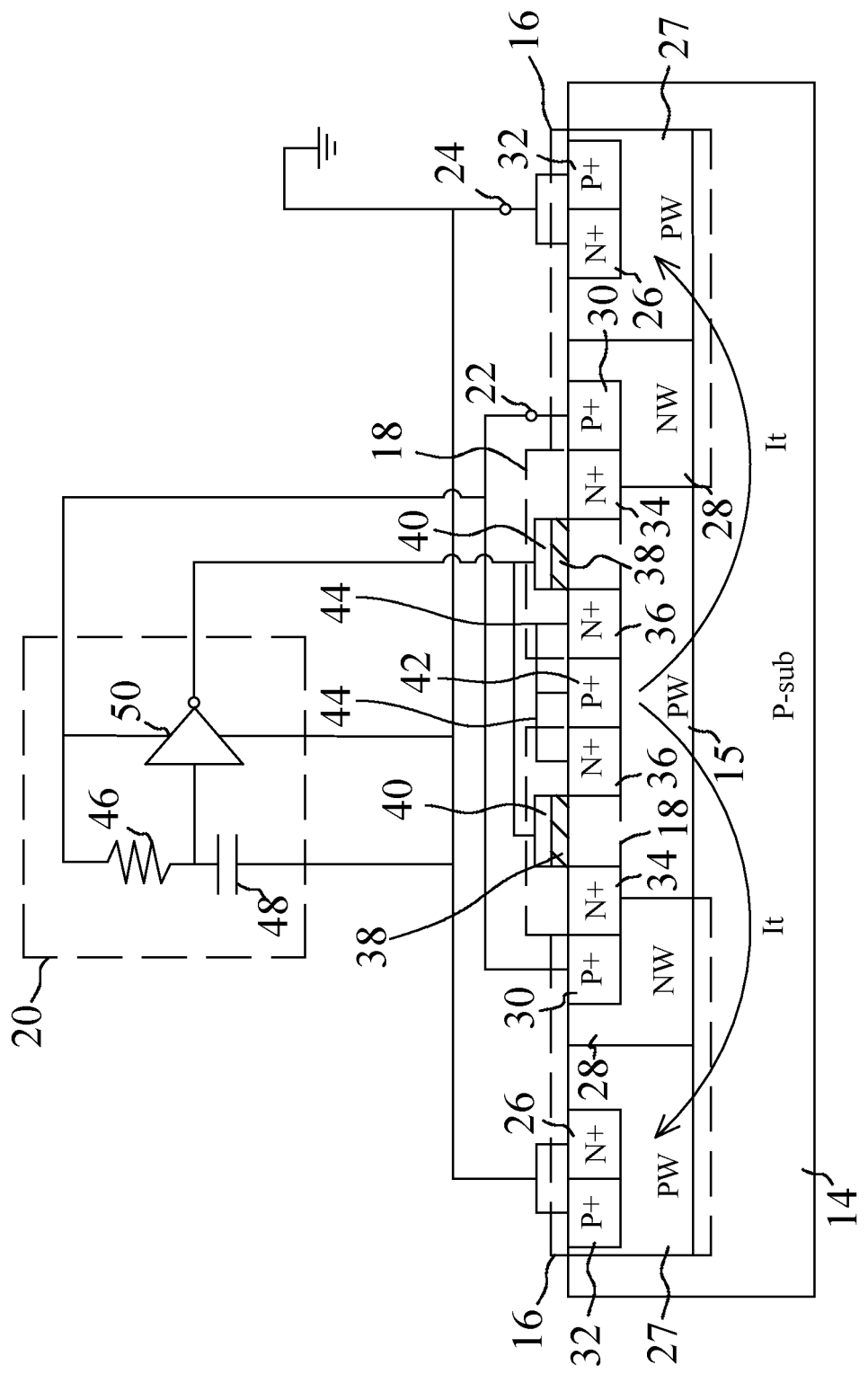
FIG. 3 is a cross-sectional view taken along Line A-A' of FIG. 2 and a diagram illustrating a signal detector according to an embodiment of the present invention.

Refer to FIG. 2 and FIG. 3. The first embodiment of the embedded N-channel metal oxide semiconductor (NMOS) triggered silicon controlled rectification device of the present invention is introduced as follows. The first embodiment comprises a P-type substrate 14, a first P-type well 15, at least one rectifying zone 16, at least one trigger 18, and a signal detector 20. In the first embodiment, the number of the rectifying zone 16 is two and the number of the trigger 18 is two. The first P-type well 15 is arranged in the P-type substrate 14. The rectifying zones 16 are arranged in the P-type substrate 14 and electrically connected to an anode 22 and a cathode 24. The rectifying zone 16 comprises a first N-type heavily doped area 26, a second P-type well 27, an N-type well 28, a first P-type heavily doped area 30, and a second P-type heavily doped area 32. The second P-type well 27 is arranged in the P-type substrate 14. The first N-type heavily doped area 26 is arranged in the second P-type well 27 and electrically connected to the cathode 24. The N-type well 28 is arranged in the P-type substrate 14. The first P-type heavily doped area 30 is arranged in the N-type well 28 and electrically connected to the anode 22. The second P-type heavily doped area 32 is arranged in the second P-type well 27 and electrically connected to the cathode 24. The triggers 18 are arranged in the first P-type well 15 and the N-type well 28. Alternatively or in combination, the trigger 18 touches the first P-type heavily doped area 30. The trigger 18 cooperates with the first P-type well 15 to form at least one N-channel metal oxide semiconductor field effect transistor (NMOSFET). In the first embodiment, the number of the NMOSFET is two. The triggers 18 are respectively independent to the rectifying zones 16 and completely arranged between the rectifying zones 16. The first P-type heavily doped area 30 is arranged between the trigger 18 and the first N-type heavily doped area 26. The signal detector 20 is electrically connected to the triggers 18, the anode 22, and the cathode 24. When an electrostatic discharge (ESD) voltage occurs at the anode 22, the signal detector 20 receives the ESD voltage to turn on the NMOSFETs, thereby triggering the silicon controlled rectifiers formed by the first P-type heavily doped areas 30, the N-type wells 28, the second P-type well 27, and the first N-type heavily doped areas 26 to bypass electrostatic discharge (ESD) currents without passing through an N-channel metal oxide semiconductor field effect transistor (NMOSFET). That is to say, the signal detector 20 receives the ESD voltage to turn on the NMOSFETs formed by the triggers 18 and the first P-type well 15, thereby generating triggering currents It. The triggering currents It help the silicon controlled rectifiers formed by the first P-type heavily doped areas 30, the N-type wells 28, the second P-type well 27, and the first N-type heavily doped areas 26 to be turned on and bypass the ESD currents. As a result, the present invention uses the NMOSFET and the signal detector 20 to decrease the clamping voltage of the silicon controlled rectifier and increase the speed of bypassing the electrostatic discharge ESD current without passing through an NMOSFET and has low-voltage applications. The signal detector 20 turns off the NMOSFETs formed by the triggers 18 and the first P-type well 15 when the ESD voltage disappears.

The trigger 18 further comprises a second N-type heavily doped area 34, a third N-type heavily doped area 36, a dielectric layer 38, and a conductive layer 40. The second N-type heavily doped area 34 is arranged in the first P-type well 15 and the N-type well 28. Alternatively or in combination, the second N-type heavily doped area 34 touches the first P-type heavily-doped area 30. The first P-type heavily doped area 30 is arranged between the first N-type heavily doped area 26 and the second N-type heavily doped area 34. The third N-type heavily doped area 36, arranged in the first P-type well 15, separates from the second N-type heavily doped area 34. The dielectric layer 38 arranged on the first P-type well 15 between the second N-type heavily doped area 34 and the third N-type heavily doped area 36. The conductive layer 40 is arranged on the dielectric layer 38 and electrically connected to the signal detector 20. The second N-type heavily doped area 34, the third N-type heavily doped area 36, the dielectric layer 38, the conductive layer 40, and the first P-type well 15 form the NMOSFET. In an embodiment of the present invention, the silicon controlled rectification device further comprises a third P-type heavily doped area 42 arranged in the first P-type well 15 and electrically connected to the third N-type heavily doped area 36 through a conductive wire 44. The third P-type heavily doped area 42 is used as the body of the NMOSFETs formed by the triggers 18 and the first P-type well 15. The rectifying zones 16 are arranged symmetric to each other with the third P-type heavily doped area 42 being an axis. Likewise, the triggers 18 are arranged symmetric to each other with the third P-type heavily doped area 42 being an axis.

The signal detector 20 further comprises a resistor 46, a capacitor 48, and an inverter 50, wherein the time constant formed by the resistor 46 and the capacitor 48 may be 0.1~1 μs. The resistor 46 and the capacitor 48 are electrically connected in series and electrically connected between the anode 22 and the cathode 24. The resistor 46 and the capacitor 48 are respectively close to the anode 22 and the cathode 24, and the cathode 24 is grounded. The inverter 50 is electrically connected to the conductive layers 40 of the triggers 18, the anode 22, the cathode 24, and a node between the resistor 46 and the capacitor 48. When the ESD voltage occurs at the anode 22, the inverter 50, the resistor 46, and the capacitor 48 receive the ESD voltage to turn on the NMOSFETs formed by the triggers 18 and the first P-type well 15. The inverter 50 turns off the NMOSFETs formed by the triggers 18 and the first P-type well 15 when the ESD voltage disappears.

Figure 4:
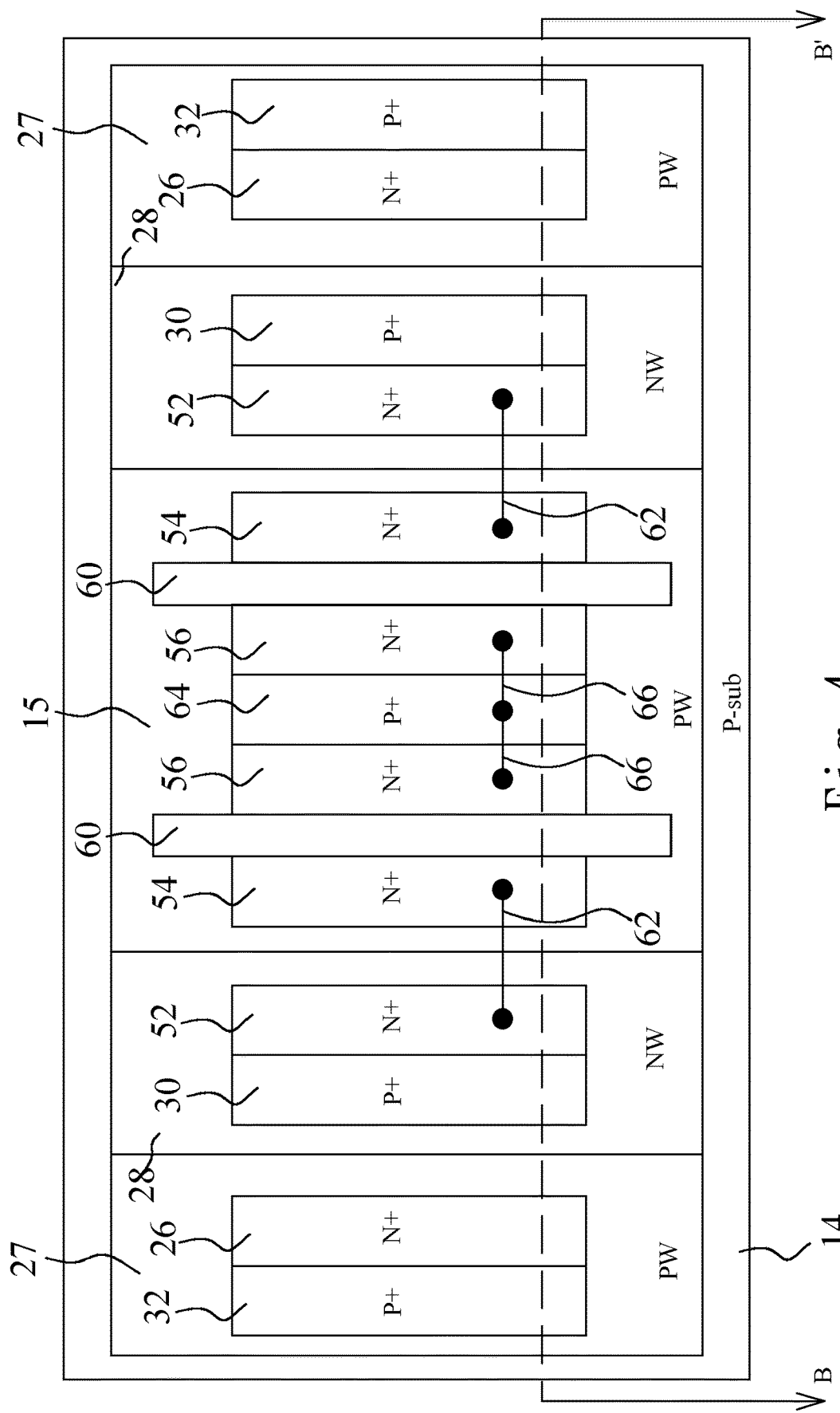
FIG. 4 is a top view of an embedded N-channel metal oxide semiconductor (NMOS) triggered silicon controlled rectification device according to the second embodiment of the present invention.
Figure 5:
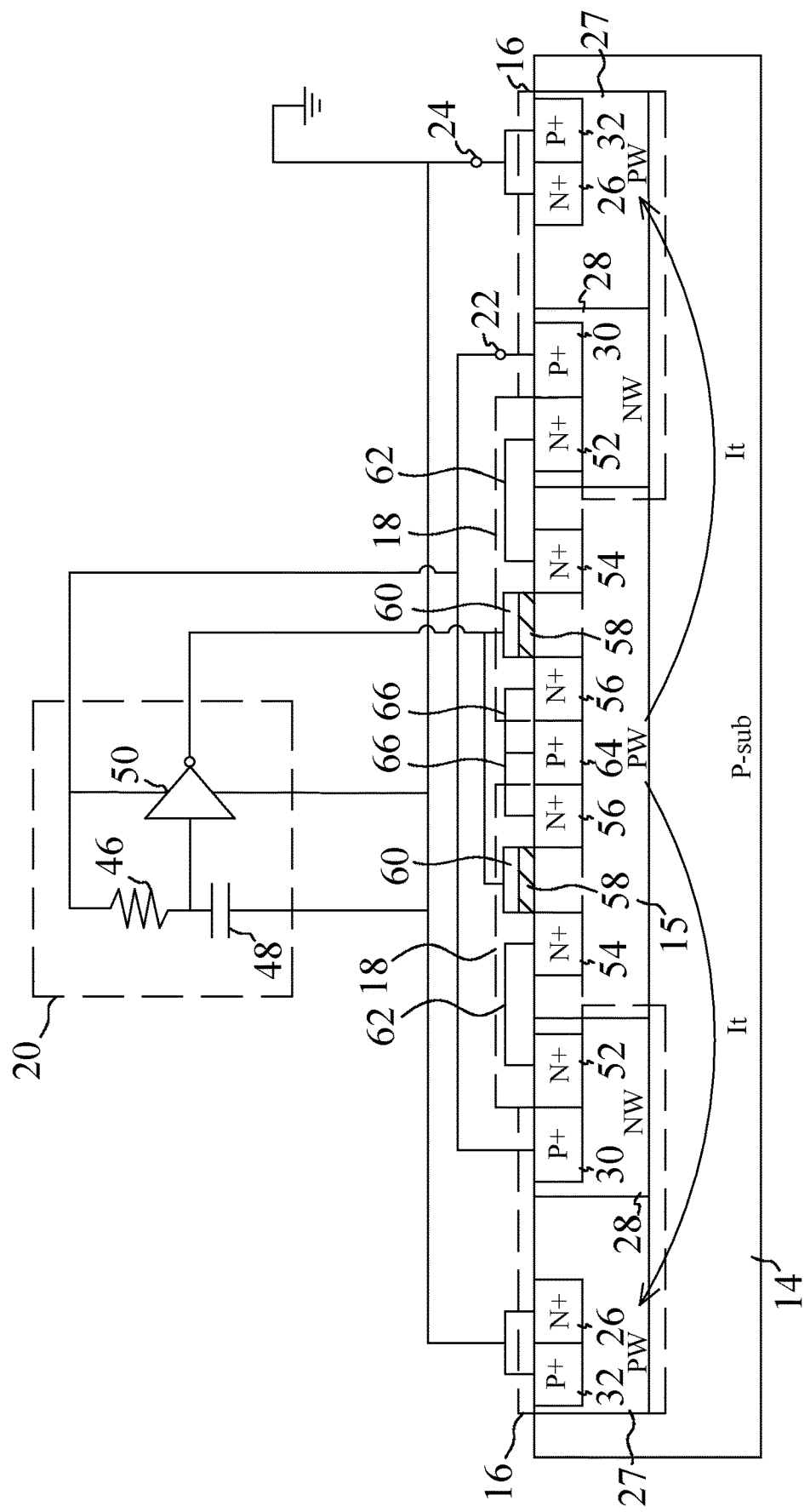
FIG. 5 is a cross-sectional view taken along Line B-B' of FIG. 4 and a diagram illustrating a signal detector according to an embodiment of the present invention.

Refer to FIG. 4 and FIG. 5. The second embodiment of the embedded N-channel metal oxide semiconductor (NMOS) triggered silicon controlled rectification device of the present invention is introduced as follows. The second embodiment is different from the first embodiment in the trigger 18. In the second embodiment, the trigger 18 further comprises a second N-type heavily doped area 52, a third N-type heavily doped area 54, a fourth N-type heavily doped area 56, a dielectric layer 58, and a conductive layer 60. The second N-type heavily doped area 52 is arranged in the N-type well 28. Alternatively or in combination, the second N-type heavily doped area 52 touches the first P-type heavily-doped area 30. The first P-type heavily doped area 30 is arranged between the first N-type heavily doped area 26 and the second N-type heavily doped area 52. The third N-type heavily doped area 54 is arranged in the first P-type well 15 and electrically connected to the second N-type heavily doped area 52 through a conductive wire 62. The fourth N-type heavily doped area 56, arranged in the first P-type well 15, separates from the third N-type heavily doped area 54. The dielectric layer 58 is arranged on the first P-type well 15 between the third N-type heavily doped area 54 and the fourth N-type heavily doped area 56. The conductive layer 60 is arranged on the dielectric layer 58 and electrically connected to the inverter 50 of the signal detector 20. The third N-type heavily doped area 54, the fourth N-type heavily doped area 56, the dielectric layer 58, the conductive layer 60, and the P-type substrate 14 form the NMOSFET. In an embodiment of the present invention, the silicon controlled rectification device further comprises a third P-type heavily doped area 64 arranged in the P-type substrate 14 and electrically connected to the fourth N-type heavily doped area 56 through a conductive wire 66. The third P-type heavily doped area 64 is used as the body of the NMOSFETs formed by the triggers 18 and the P-type substrate 14.

The inverter 50, the resistor 46, and the capacitor 48 receive the ESD voltage to turn on the NMOSFETs formed by the triggers 18 and the first P-type well 15, thereby generating triggering currents It. The triggering currents It help the silicon controlled rectifiers formed by the first P-type heavily doped areas 30, the N-type wells 28, the second P-type well 27, and the first N-type heavily doped areas 26 to be turned on and bypass the ESD currents. As a result, the present invention uses the NMOSFET and the signal detector 20 to decrease the clamping voltage of the silicon controlled rectifier and increase the speed of bypassing the electrostatic discharge ESD current without passing through an NMOSFET and has low-voltage applications. The inverter 50 of the signal detector 20 turns off the NMOSFETs formed by the triggers 18 and the first P-type well 15 when the ESD voltage disappears.

Figure 6:
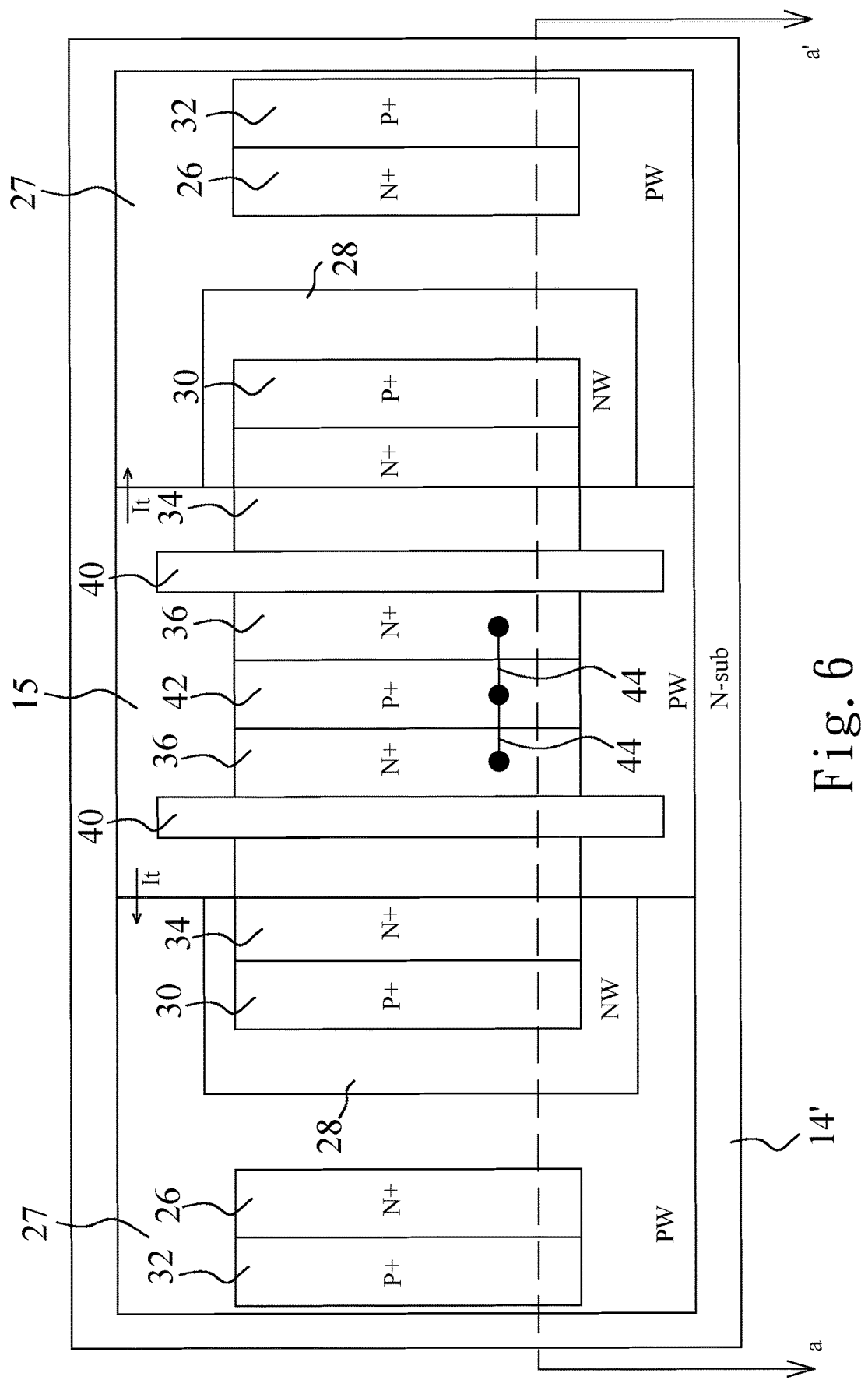
FIG. 6 is a top view of an embedded N-channel metal oxide semiconductor (NMOS) triggered silicon controlled rectification device according to the third embodiment of the present invention.
Figure 7:
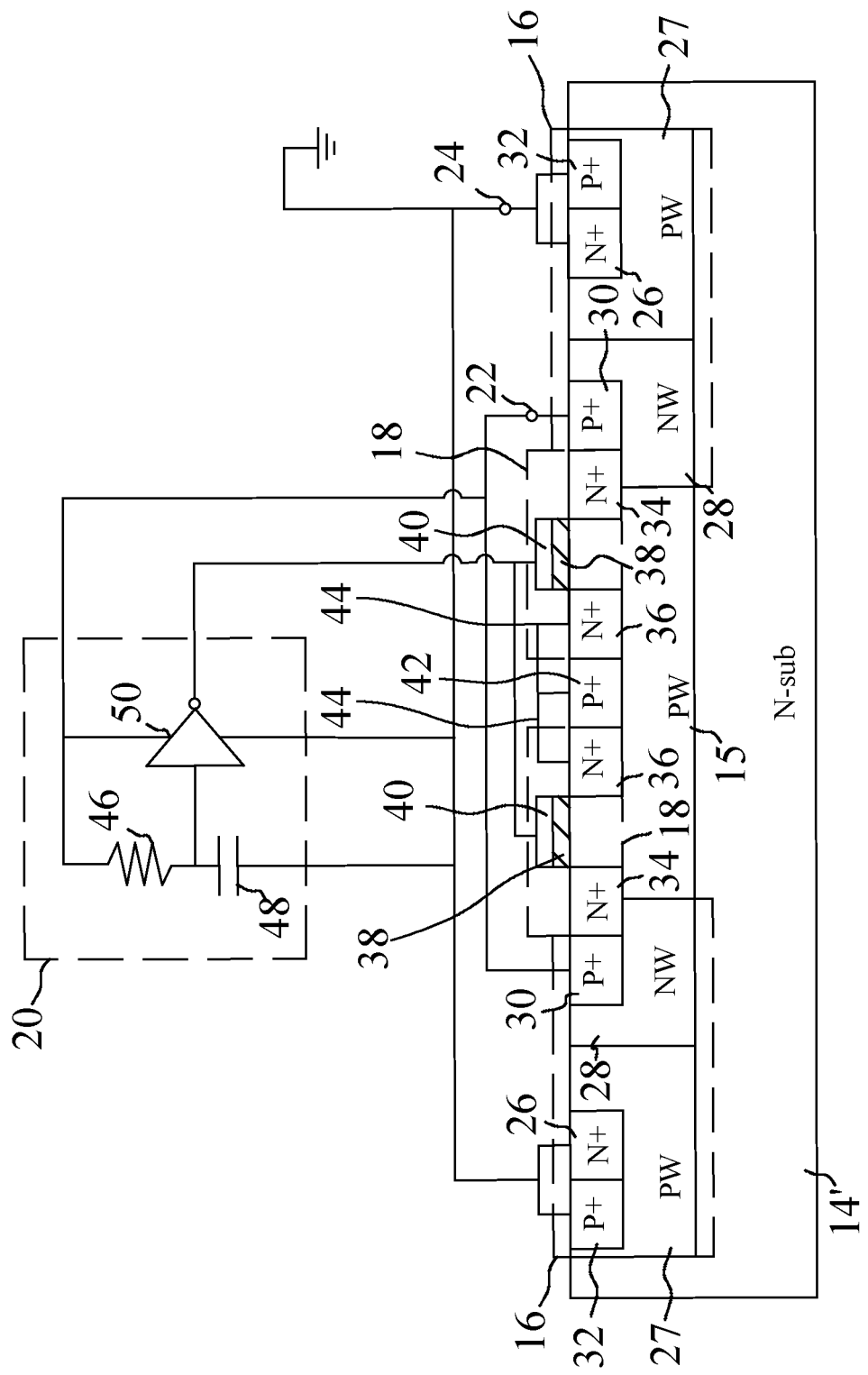
FIG. 7 is a cross-sectional view taken along Line a-a' of FIG. 6 and a diagram illustrating a signal detector according to an embodiment of the present invention.

Refer to FIG. 3, FIG. 6 and FIG. 7. The third embodiment of the embedded N-channel metal oxide semiconductor (NMOS) triggered silicon controlled rectification device of the present invention is introduced as follows. Compared with the first embodiment, the third embodiment uses an N-type substrate 14' to replace the P-type substrate 14. The other structures and the operation of the third embodiment are the same to those of the first embodiment so will not be reiterated. The third embodiment can achieve the purpose that the first embodiment achieves.

Figure 8:
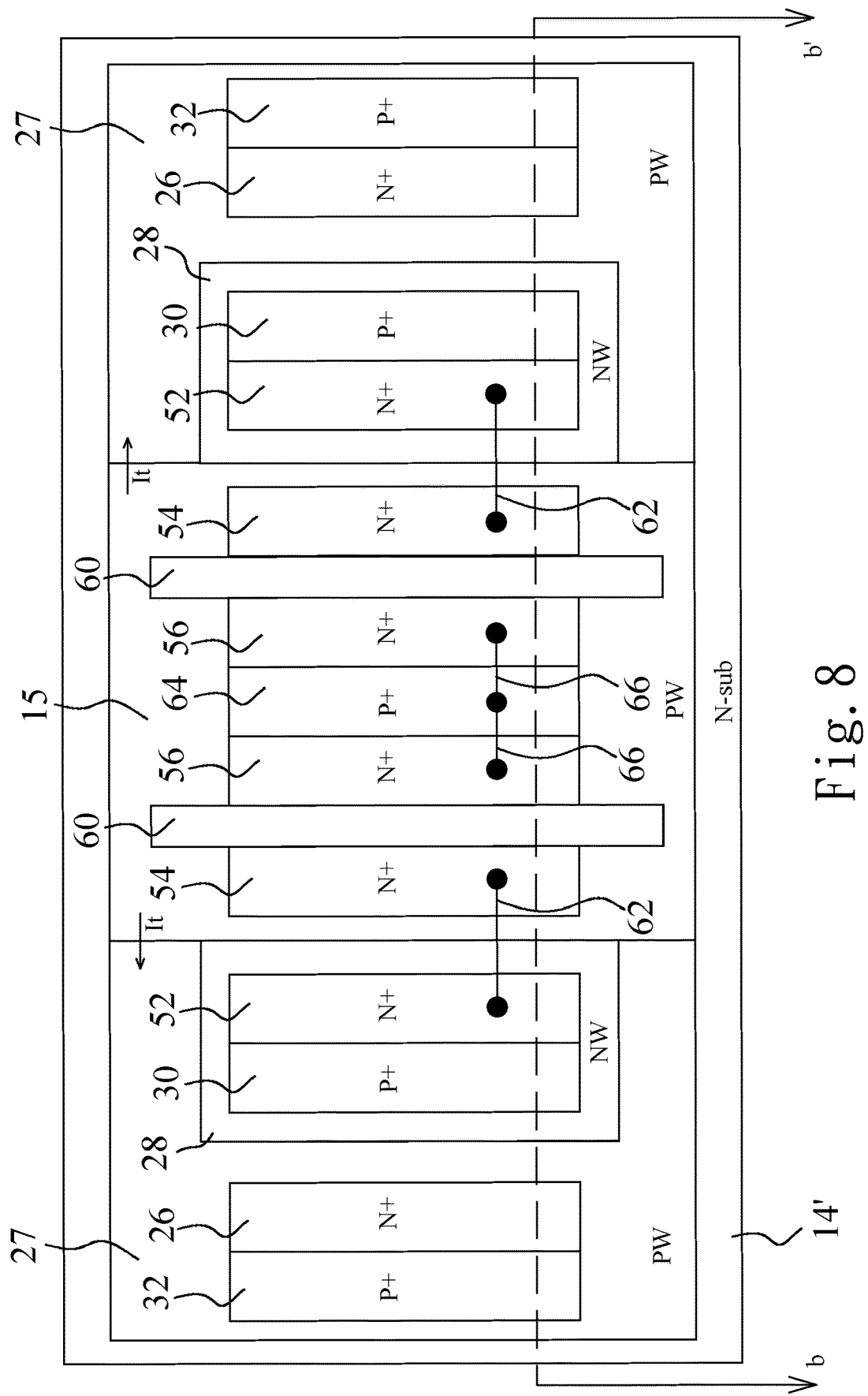
FIG. 8 is a top view of an embedded N-channel metal oxide semiconductor (NMOS) triggered silicon controlled rectification device according to the fourth embodiment of the present invention.
Figure 9:
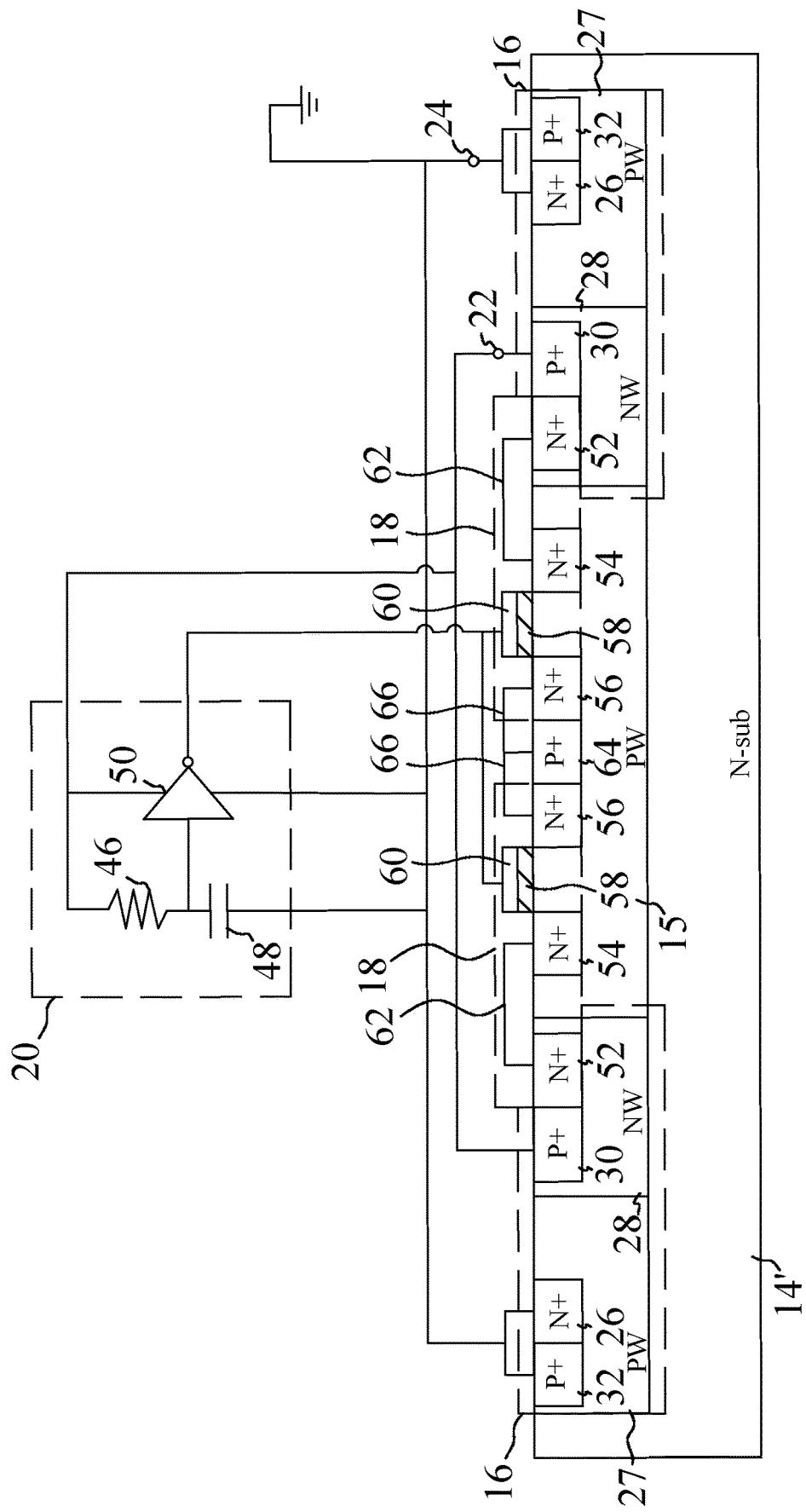
FIG. 9 is a cross-sectional view taken along Line b-b' of FIG. 8 and a diagram illustrating a signal detector according to an embodiment of the present invention.

Refer to FIG. 5, FIG. 8 and FIG. 9. The fourth embodiment of the embedded N-channel metal oxide semiconductor (NMOS) triggered silicon controlled rectification device of the present invention is introduced as follows. Compared with the second embodiment, the fourth embodiment uses an N-type substrate 14' to replace the P-type substrate 14. The other structures and the operation of the fourth embodiment are the same to those of the second embodiment so will not be reiterated. The fourth embodiment can achieve the purpose that the second embodiment achieves.

In conclusion, the present invention does not form an NMOSFET in the path from the anode of the silicon controlled rectifier to the cathode of the silicon controlled rectifier to avoid increasing the turn-on resistance of the silicon controlled rectifier. In addition, the present invention cooperates with the signal detector to provide a lower clamping voltage for low-voltage applications.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An embedded N-channel metal oxide semiconductor (NMOS) triggered silicon controlled rectification device comprising:
   a P-type substrate;
   at least one rectifying zone, arranged in the P-type substrate and electrically connected to an anode and a cathode, comprising:
     a first N-type heavily doped area arranged in the P-type substrate and electrically connected to the cathode;

an N-type well arranged in the P-type substrate; and
a first P-type heavily doped area arranged in the N-type well and electrically connected to the anode; and
at least one trigger, arranged in the P-type substrate and the N-type well, cooperating with the P-type substrate to form at least one N-channel metal oxide semiconductor field effect transistor (NMOSFET), the at least one trigger is independent to the at least one rectifying zone, and the first P-type heavily doped area is arranged between the at least one trigger and the first N-type heavily doped area;
wherein the anode and the cathode are disconnected from a gate, a source, and a drain of the at least one N-channel metal oxide semiconductor field effect transistor;
wherein the first P-type heavily doped area separates the at least one trigger from the first N-type heavily doped area.

2. The NMOS triggered silicon controlled rectification device according to claim 1, further comprising a signal detector electrically connected to the at least one trigger, the anode, and the cathode, when an electrostatic discharge (ESD) voltage occurs at the anode, the signal detector receives the ESD voltage to turn on the at least one NMOSFET, thereby triggering the first P-type heavily doped area, the N-type well, the P-type substrate, and the first N-type heavily doped area to bypass an electrostatic discharge (ESD) current.

3. The NMOS triggered silicon controlled rectification device according to claim 2, wherein the signal detector turns off the at least one NMOSFET when the ESD voltage disappears.

4. The NMOS triggered silicon controlled rectification device according to claim 1, wherein the at least one rectifying zone further comprises a second P-type heavily doped area arranged in the P-type substrate and electrically connected to the cathode.

5. The NMOS triggered silicon controlled rectification device according to claim 1, wherein the at least one trigger further comprises:
a second N-type heavily doped area arranged in the P-type substrate and the N-type well, and the first P-type heavily doped area is arranged between the first N-type heavily doped area and the second N-type heavily doped area;
a third N-type heavily doped area, arranged in the P-type substrate, separating from the second N-type heavily doped area;
a dielectric layer arranged on the P-type substrate between the second N-type heavily doped area and the third N-type heavily doped area; and
a conductive layer arranged on the dielectric layer and electrically connected to the signal detector, and the second N-type heavily doped area, the third N-type heavily doped area, the dielectric layer, the conductive layer, and the P-type substrate form the at least one NMOSFET.

6. The NMOS triggered silicon controlled rectification device according to claim 5, further comprising a third P-type heavily doped area arranged in the P-type substrate and electrically connected to the third N-type heavily doped area through a conductive wire.

7. The NMOS triggered silicon controlled rectification device according to claim 1, wherein the at least one trigger further comprises:
a second N-type heavily doped area arranged in the N-type well, and the first P-type heavily doped area is arranged between the first N-type heavily doped area and the second N-type heavily doped area;
a third N-type heavily doped area arranged in the P-type substrate and electrically connected to the second N-type heavily doped area through a conductive wire;
a fourth N-type heavily doped area, arranged in the P-type substrate, separating from the third N-type heavily doped area;
a dielectric layer arranged on the P-type substrate between the third N-type heavily doped area and the fourth N-type heavily doped area; and
a conductive layer arranged on the dielectric layer and electrically connected to the signal detector, and the third N-type heavily doped area, the fourth N-type heavily doped area, the dielectric layer, the conductive layer, and the P-type substrate form the at least one NMOSFET.

8. The NMOS triggered silicon controlled rectification device according to claim 7, further comprising a third P-type heavily doped area arranged in the P-type substrate and electrically connected to the fourth N-type heavily doped area through a conductive wire.

9. The NMOS triggered silicon controlled rectification device according to claim 1, wherein the at least one rectifying zone further comprises two rectifying zones arranged symmetric to each other.

10. The NMOS triggered silicon controlled rectification device according to claim 1, wherein the at least one trigger further comprises two triggers arranged symmetric to each other.

11. The NMOS triggered silicon controlled rectification device according to claim 1, further comprising a first P-type well arranged in the P-type substrate, and the at least one trigger is arranged in the first P-type well.

12. The NMOS triggered silicon controlled rectification device according to claim 11, wherein the at least one rectifying zone further comprises a second P-type well arranged in the P-type substrate, and the first N-type heavily doped area arranged in the second P-type well.

13. The NMOS triggered silicon controlled rectification device according to claim 2, wherein the signal detector further comprises:
a resistor and a capacitor electrically connected in series and electrically connected between the anode and the cathode, and the cathode is grounded; and
an inverter electrically connected to the at least one trigger, the anode, the cathode, and a node between the resistor and the capacitor, and when the ESD voltage occurs at the anode, the inverter, the resistor, and the capacitor receive the ESD voltage to turn on the at least one NMOSFET.

14. An embedded N-channel metal oxide semiconductor (NMOS) triggered silicon controlled rectification device comprising:
an N-type substrate;
a first P-type well arranged in the N-type substrate;
at least one rectifying zone, arranged in the N-type substrate and electrically connected to an anode and a cathode, comprising:
a second P-type well arranged in the N-type substrate;
a first N-type heavily doped area arranged in the second P-type well and electrically connected to the cathode; and
a first P-type heavily doped area arranged in the N-type substrate and electrically connected to the anode; and
at least one trigger, arranged in the N-type substrate and the first P-type well, cooperating with the first P-type well to form at least one N-channel metal oxide semiconductor field effect transistor (NMOSFET), the at least one trigger is independent to the at least one rectifying zone, and the first P-type heavily doped area is arranged between the at least one trigger and the first N-type heavily doped area;

wherein the anode and the cathode are disconnected from a gate, a source, and a drain of the at least one N-channel metal oxide semiconductor field effect transistor;

wherein the first P-type heavily doped area separates the at least one trigger from the first N-type heavily doped area.

15. The NMOS triggered silicon controlled rectification device according to claim 14, further comprising a signal detector electrically connected to the at least one trigger, the anode, and the cathode, when an electrostatic discharge (ESD) voltage occurs at the anode, the signal detector receives the ESD voltage to turn on the at least one NMOSFET, thereby triggering the first P-type heavily doped area, the N-type substrate, the second P-type well, and the first N-type heavily doped area to bypass an electrostatic discharge (ESD) current.

16. The NMOS triggered silicon controlled rectification device according to claim 15, wherein the signal detector turns off the at least one NMOSFET when the ESD voltage disappears.

17. The NMOS triggered silicon controlled rectification device according to claim 14, wherein the at least one rectifying zone further comprises a second P-type heavily doped area arranged in the second P-type well and electrically connected to the cathode.

18. The NMOS triggered silicon controlled rectification device according to claim 14, wherein the at least one trigger further comprises:
a second N-type heavily doped area arranged in the N-type substrate and the first P-type well, and the first P-type heavily doped area is arranged between the first N-type heavily doped area and the second N-type heavily doped area;
a third N-type heavily doped area, arranged in the first P-type well, separating from the second N-type heavily doped area;
a dielectric layer arranged on the first P-type well between the second N-type heavily doped area and the third N-type heavily doped area; and
a conductive layer arranged on the dielectric layer and electrically connected to the signal detector, and the second N-type heavily doped area, the third N-type heavily doped area, the dielectric layer, the conductive layer, and the first P-type well form the at least one NMOSFET.

19. The NMOS triggered silicon controlled rectification device according to claim 18, further comprising a third P-type heavily doped area arranged in the first P-type well and electrically connected to the third N-type heavily doped area through a conductive wire.

20. The NMOS triggered silicon controlled rectification device according to claim 17, wherein the at least one trigger further comprises:
a second N-type heavily doped area arranged in the N-type substrate, and the first P-type heavily doped area is arranged between the first N-type heavily doped area and the second N-type heavily doped area;
a third N-type heavily doped area arranged in the first P-type well and electrically connected to the second N-type heavily doped area through a conductive wire;
a fourth N-type heavily doped area, arranged in the first P-type well, separating from the third N-type heavily doped area;
a dielectric layer arranged on the first P-type well between the third N-type heavily doped area and the fourth N-type heavily doped area; and
a conductive layer arranged on the dielectric layer and electrically connected to the signal detector, and the third N-type heavily doped area, the fourth N-type heavily doped area, the dielectric layer, the conductive layer, and the first P-type well form the at least one NMOSFET.

21. The NMOS triggered silicon controlled rectification device according to claim 20, further comprising a third P-type heavily doped area arranged in the first P-type well and electrically connected to the fourth N-type heavily doped area through a conductive wire.

22. The NMOS triggered silicon controlled rectification device according to claim 14, wherein the at least one rectifying zone further comprises two rectifying zones arranged symmetric to each other.

23. The NMOS triggered silicon controlled rectification device according to claim 14, wherein the at least one trigger further comprises two triggers arranged symmetric to each other.

24. The NMOS triggered silicon controlled rectification device according to claim 14, wherein the at least one rectifying zone further comprises an N-type well arranged in the N-type substrate, and the first P-type heavily doped area and the at least one trigger are arranged in the N-type well.

25. The NMOS triggered silicon controlled rectification device according to claim 15, wherein the signal detector further comprises:
a resistor and a capacitor electrically connected in series and electrically connected between the anode and the cathode, and the cathode is grounded; and
an inverter electrically connected to the at least one trigger, the anode, the cathode, and a node between the resistor and the capacitor, and when the ESD voltage occurs at the anode, the inverter, the resistor, and the capacitor receive the ESD voltage to turn on the at least one NMOSFET.

* * * * *